United States Patent [19]

Patil

[11] 4,293,783
[45] Oct. 6, 1981

[54] STORAGE/LOGIC ARRAY

[75] Inventor: Suhas S. Patil, Salt Lake City, Utah

[73] Assignee: Massachusetts Institute of Technology, Cambridge, Mass.

[21] Appl. No.: 956,794

[22] Filed: Nov. 1, 1978

[51] Int. Cl.³ .................. H03K 19/177; H03K 19/091; H04Q 3/00

[52] U.S. Cl. .................... 307/465; 307/289; 307/477; 340/166 R; 364/716

[58] Field of Search .................. 307/203, 207, 289; 340/166 R; 364/716; 365/231

[56] References Cited

U.S. PATENT DOCUMENTS

| | | | |
|---|---|---|---|
| 3,816,725 | 6/1974 | Greer | 340/166 R X |
| 3,818,252 | 6/1974 | Chiba et al. | 307/207 X |
| 3,818,452 | 6/1974 | Greer | 340/166 R |
| 3,849,638 | 11/1974 | Greer | 307/207 X |
| 3,909,805 | 9/1975 | Touron et al. | 340/166 R X |
| 4,021,656 | 5/1977 | Caudel et al. | 307/207 X |
| 4,024,352 | 5/1977 | Mukaemachi et al. | 340/166 R X |
| 4,068,214 | 1/1978 | Patil | 340/166 R |
| 4,068,215 | 1/1978 | Mukaemachi et al. | 340/166 R |
| 4,124,899 | 11/1978 | Birkner et al. | 307/207 X |
| 4,177,452 | 12/1979 | Balasubramanian et al. | 340/166 R |

OTHER PUBLICATIONS

Patil, "Micro-Control for Parallel Asynchronous Computers", *Microarchitecture of Computer Systems*, R. W. Hartenstein & R. Zaks (eds.), North-Holland Publ. Co. 1975.

Greer, "An Associative Logic Matrix", *IEEE Journ. of Solid-State Circuits*, vol. SC-11, No. 5, pp. 679-691, 10/1976.

*Primary Examiner*—Larry N. Anagnos
*Attorney, Agent, or Firm*—Arthur A. Smith, Jr.; Mark G. Lappin

[57] ABSTRACT

A storage/logic array (SLA). In a programmable form (PSLA), the array includes a set of parallel, programmably segmentable column conductors and an orthogonal set of programmably segmentable row conductors. Each of a plurality of cell networks is associated with and coupled to a subset of the row conductors and a subset of the column conductors. At least one column conductor subset has an associated cell network which includes a storage element which is coupled to the associated column subset and row subset for that cell network. In a nonprogrammable form, the SLA is similar to the programmable form (PSLA) except that row and column conductors are segmented at predetermined locations, and cell networks are coupled to predetermined, associated subsets of the row and column conductors.

37 Claims, 35 Drawing Figures

STORAGE/LOGIC ARRAY

The Government has rights in this invention pursuant to Grant No. DCR74-21288 and IPA-0010 awarded by the National Science Foundation.

REFERENCE TO RELATED PATENT

This application is related to U.S. Pat. No. 4,068,214, which is hereby incorporated by reference.

BACKGROUND OF THE DISCLOSURE

This invention relates to the field of digital systems and more particularly to devices for implementing digital systems.

The advent of Very Large Scale Integrated (VLSI) circuit technology offers new opportunities and poses new design problems to the computer architect. This technology promises a substantial reduction in the cost of high volume components, such as microprocessors. However, the promised economics may not be achieved in larger computers using conventional design techniques since the time and the cost involved in designing a particular VLSI chip using conventional techniques is very high (e.g., one year and a 100,000 dollars is not uncommon) and the number of each VLSI component needed in the production of such computers may be relatively small, making unit cost very high. Consequently, a universal VLSI chip that can be specialized to implement various digital sub-systems is very desirable, especially if the specialization can be done in a manner similar to conventional ROM programming.

The prior art approaches to utilizing VLSI technology are exemplified by developments in programmable logic array (PLA) circuitry. The traditional PLA is a combinational circuit which produces multiple Boolean outputs from its inputs. It differs from a read-only memory (ROM) only in that implicants of Boolean functions are stored rather than the minterms, so that it is not necessary to have a word of storage for every input combination. It is usually implemented in the form of two arrays: an "AND" array which forms selected conjunction signals (implicants) based on input data, and an "OR" array which combines conjunction signals to form the correct outputs. The array is programmed by selecting (via make-break connections) whether a conjunction line is gated by a 1, 0, or neither on each input, and whether an output line responds to a conjunction line or not. These may be viewed as diode connections, as in a ROM.

In most computer designs, there is little opportunity to use PLA's because it is rare to have several signals which are complex functions of the same small set of input signals, and most cases that do occur are implementable with ROM's. Large size combinational PLA's are not useable, due to pin limitations constraining the number of inputs available. In response to pin limitations, some PLA's have added flip-flops on the chip, to provide feedback from outputs back to inputs in classic state-machine style. While these PLA's can be used in a much wider range of applications, they suffer from having too few flip-flops and from inefficient utilization of the logic potential in the AND and OR arrays. U.S. Pat. Nos. 3,816,725, 3,818,452 and 3,849,638 to D. L. Greer exemplify prior art approaches to the use of PLA.

It is an object of the present invention to provide a universal logic element for digital systems.

It is another object to provide a logic array for implementing multiple output, combinational and sequential, synchronous and asynchronous networks.

It is yet another object to provide a logic array which may be split into multiple sections for performing independent functions.

It is a further object to provide a universal logic array which is programmable.

Still another object is to provide a programmable logic array which is densely packed with respect to functions.

SUMMARY OF THE INVENTION

Briefly, the storage/logic array (SLA) of the present invention is a logic array which includes at least one storage element within the array. The SLA may be configured on a single chip using conventional integrated circuit technology.

In one form, the SLA may have the general form of a programmable logic array (PLA) having a set of substantially parallel column conductors, and a set of substantially parallel row conductors overlying and orthogonal to the column conductors. Input and output connections to the SLA are made at the edges of the array. In the array, overlapping portions of non-intersecting subsets of row and column conductors are associated with one of a plurality of cell networks. In addition, in the SLA, one or more of the cell networks includes a storage element, such as a set-reset flip flop. Programmable contacts are provided for the cell networks so that the respective cell networks may be selectively coupled to their associated row and column conductors. Programmable contacts are also provided for selectively coupling the various storage elements to their associated row and column conductors.

In alternate forms, the SLA may not be programmable, but may rather be a custom array adapted to perform a specific function. This latter form may be substantially similar to a programmed SLA, with the non-coupled cell networks and storage elements being omitted from the array. While not being programmable, this form has all the other characteristics of the programmable form.

In effect, the AND array and OR array of prior art PLA's are folded together so that input lines and output lines are alternated in a single array. This has two effects: (i) a substantial number of storage elements can be included without excess input/output routing space overhead, and (ii) array rows (conjunction signals) can be split into multiple independent pieces which can carry variables over smaller portions of the array. With the storage elements located at intervals along the columns of the array, the columns can be broken into independent variables with localized access. As a result of these factors, the SLA may be used in quite a different manner than the PLA. Portions of the array can be used for independent tasks, such as, for example, using one upper corner to build an adder while using the other upper corner for sequencing control and the lower rows for a register structure. Compared with prior art PLA's, this approach permits a much denser packing of logic into an array and permits execution of more complex functions.

With these configurations, the SLA is faster than conventional microprocessors with control program in ROM for several reasons. First, data paths in a standard processor will typically fail to exactly match the needs of particular applications, requiring extra program steps to extract and combine odd-sized data fields, while the SLA can easily be adapted to varying data sizes. Second, the storage of control information in a ROM chip external to the processor requires extra delay, particularly in test/branch conditions, due to inter-chip delay times which are much longer than intrachip delays. Third, standard processors can generally execute only one action at a time, while the SLA may readily carry out concurrent actions. While these problems in the speed of microprogrammed machines might be overcome by (a) using several processors in parallel, (b) building custom processors with special data paths, or (c) incorporating the ROM onto the processor chip, these techniques tend to eliminate any possible cost advantage of the microprogrammed approach. Thus, the SLA is particularly used for applications requiring higher performance, particularly when unusual data paths are involved.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
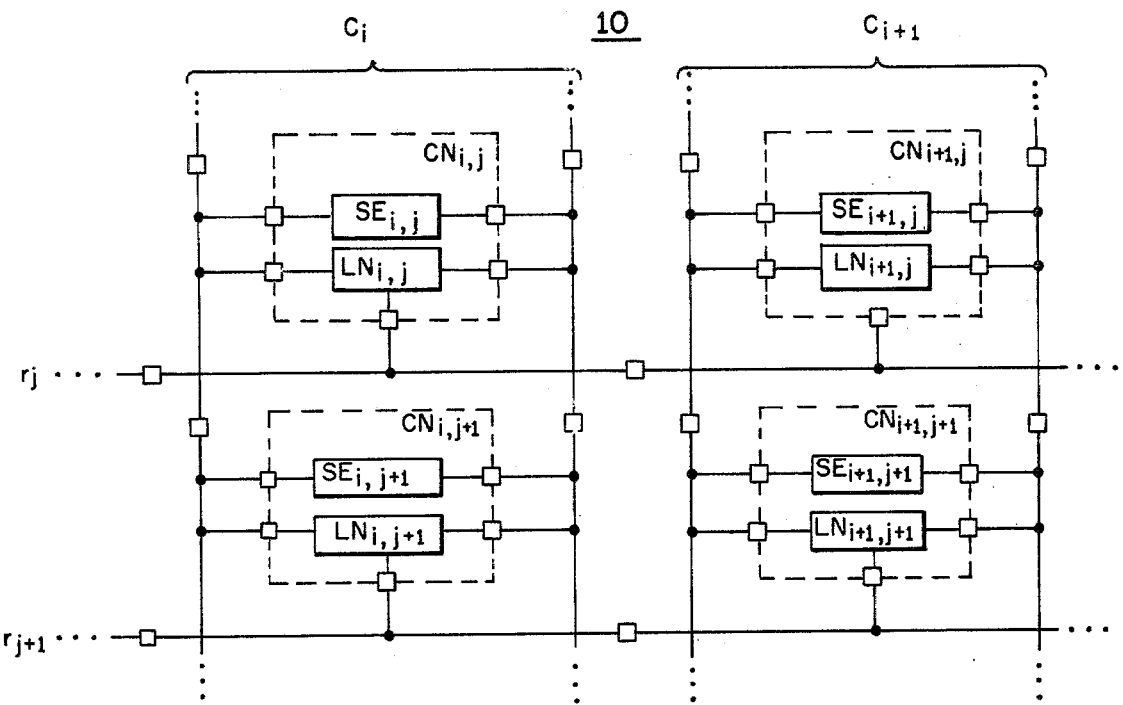
FIG. 1 shows in block diagram form a programmable storage/logic array (PSLA) in accordance with the present invention.

FIG. 1 shows a portion of a programmable storage/logic array (PSLA) 10 in schematic form. In that figure, a set of column conductors (including non-intersecting subsets $C_i$, $C_{i+1}$, where each subset includes two conductors in this embodiment) is disposed orthogonally with respect to a set of row conductors (including non-intersecting subsets $r_j$, $r_{j+1}$, where each subset includes one conductor in this embodiment). PSLA also includes four substantially similar cell networks $CN_{i,j}$, $CN_{i+1,j}$, $CN_{i+1,j+1}$, $CN_{i,j+1}$ is shown, each cell network including a storage element (SE) and a logic network (LN) and being associated with the subsets of column and row conductors indicated by the subscripts. Each cell network also includes programmable contacts (indicated by the small hollow squares in FIG. 1) for selectively coupling the storage element and logic network to the row and column conductors. The row and column conductors also include programmable contacts which may be selectively used to segment the respective row and column conductors.

In the exemplary embodiment of FIG. 1, the PSLA 10 is shown with two conductors in each column subset and one conductor in each row subset, and each cell network includes a storage element as well as a logic network. The storage element includes two gates and an associated cross-coupling network. The cross-coupling network may programmably configure the storage element as a set-reset flip-flop, or as a single operative gate, or as inoperative. In addition, the row and column conductor may be segmented at every cell network. In alternative embodiments, these parameters may readily be varied. For example, in the embodiment described below in conjunction with FIGS. 7-10 there are four conductors in each column subset and one in each row subset. In that embodiment, the rows may be programmably segmented every four columns, and the columns may be programmably segmented every sixteen rows.

As a logical element, the PSLA 10 has the following characteristics:

(i) Each logical column is a Boolean variable, implemented by several conductors and a storage element, such as a flip-flop (the flip-flop may be inoperative in some cases so that the column is memory-less).

(ii) Each row is an implicant, or conjunction term, implemented by a single conductor.

(iii) A row's inputs may be either: (a) a column variable, (b) its complement, or (c) no connection to the variable; these inputs are "AND"ed to form the row's value.

(iv) A column's inputs may be either: (a) a row SET's the value of the column variable, (b) a row RESET's the variable, or (c) the row is not connected.

(v) Rows may be optionally split at break points provided every X columns (e.g. X=4).

(vi) Columns may be optionally split, with an independent flip-flop being operative for each piece, at points provided every Y rows (e.g. Y=16).

Various columns are connected to PSLA chip input and output pins by suitable interface drivers; this interconnection may be conventional and is not described in detail here.

Figure 2:
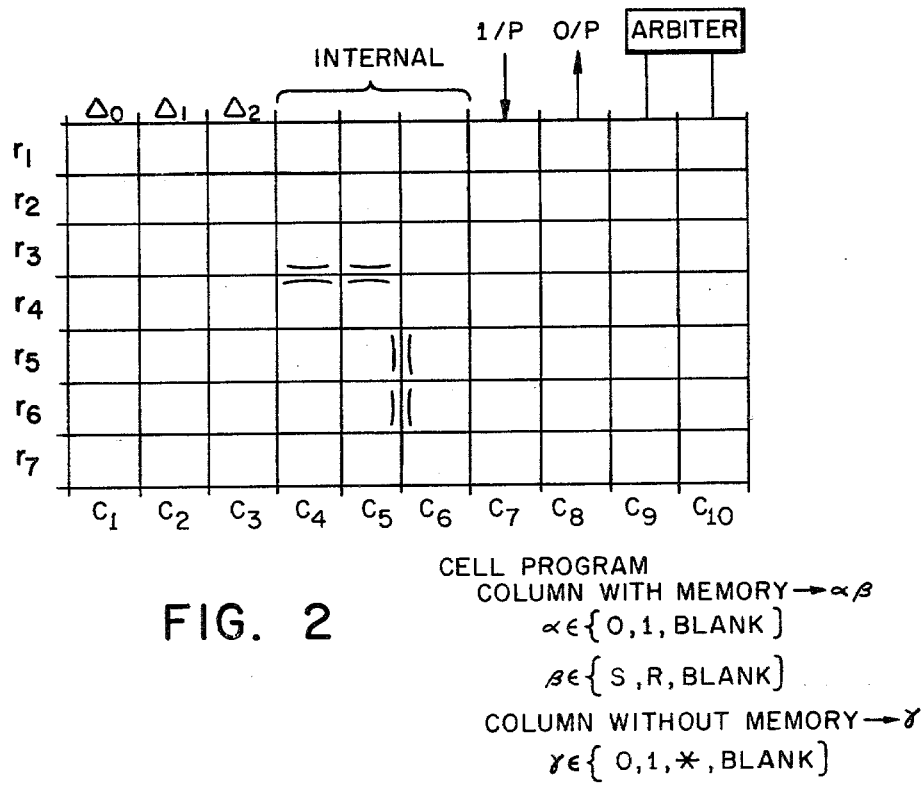
FIG. 2 shows a programmable representation of a PSLA.

FIG. 2 shows a representation of PSLA 10 as programmed, wherein each block represents a cell network of the array. The columns are numbered for reference purposes from left-to-right, and the rows are numbered from top-to-bottom.

Columns 4-6 represent internal variables for the array. Column 7 represents an input for an internal variable (flip-flop) and column 8 represents an output for an internal variable. These columns may be coupled by input and output drivers, respectively, to external networks.

The programmed coupling of the logic network portion of a cell network to the column and row conductors of its associated column and row segments in FIG.

2 may be indicated by the following notations in the corresponding block:

(1) $\alpha,\beta$ for a cell network associated with a column segment having memory (i.e. with a storage element, or flip-flop, operative), where $\alpha$ may be 1, 0 or blank (no connection), and $\beta$ may be S,R or blank (no connection).

$\alpha,\beta$ = (blank, blank) indicates that the logic network of the cell network is wholly unconnected to the array.

$\alpha,\beta$ = (1 or 0, blank) indicates that the row is activated only if the column segment takes on the specified value and, in this case, the cell network functions as a cell network without memory (although the cell network may be a part of a column segment having an operative flip-flop in another cell network in that column segment).

$\alpha,\beta$ = (blank, S or R) indicates that a set or reset action is imparted to any operative flip-flop in the column segment when the row conductor is activated; in this case any such operative flip-flop may be set or reset.

$\alpha,\beta$ = (1R or 0S) indicates the composite conditions defined above; in these cases any operative flip-flop in the column segment is toggled.

(2) $\gamma$ for a cell network without memory (i.e. with the flip-flop inoperative), where $\beta$ may be 1, 0, * or blank (no connection).

$\gamma$ = (blank) indicates that the cell network is not coupled to the row and column conductors.

$\gamma$ = (1 or 0) indicates that the row is activated only if the associated column takes on the specified value, i.e. the Boolean 1 or 0 condition is detected for the column.

$\gamma$ = (*) indicates that the column functions as a Boolean OR of the condition of all rows at which *'s appear in the column.

Row and column segmentation is indicated in the notation for FIG. 2 by parenthesis. For example, columns 4 and 5 are each split into two segments, the first including rows 1–3 and the second including rows 4–7. Similarly, rows 5 and 6 are each split into two segments, the first including columns 1–5 and the second including columns 6–10.

Programming of columns as monostable flip-flops is indicated for columns 1–3 of FIG. 2 by $\Delta_o$, $\Delta_1$ and $\Delta_2$, respectively. After any of these columns is set to its state 1 by an internal variable coupled by one of the rows, the column returns to its stage 0 after a length of time ($\Delta_o$, $\Delta_1$, or $\Delta_2$, respectively) determined by external monostable circuits coupled to the respective columns. Such columns function as delay elements whose characteristic delay is controlled by external components.

The array also contains columns 9 and 10 (without memory) which are connected to an external arbiter. When activated by the rows to enter into their respective state 1, the arbiter ensures that only one of the arbitrated columns is allowed to assume the Boolean state 1 at a time. Thus, if one of the arbitrated columns is already in state 1, then the other column is not allowed to assume state 1 until the first column is changed to state 0 by actions of the rows. Arbiters are provided for resolution of conflicts, as described more fully in the incorporated reference.

Programming of the PSLA requires the specification of input and output connections to the array, specification of required splitting of the columns and rows into segments, specification of which segmented columns have memory and which are memoryless, and specification of programming for the various cells of the array. The PSLA may be used to implement asynchronous sequential machines and Petri nets. Although the SLA is essentially an asynchronous device, clocked synchronous circuits can be implemented with explicitly incorporating a clock signal into the program for the array. Exemplary synchronous and asynchronous implementations are presented below.

EXAMPLE 1—Synchronous Sequential Machine

Figure 3A:
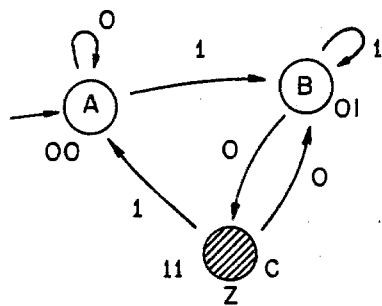
FIGS. 3A and 3B show a state diagram for an exemplary synchronous sequential machine and representation of programmed SLA implementation of that machine, respectively.
Figure 3B:
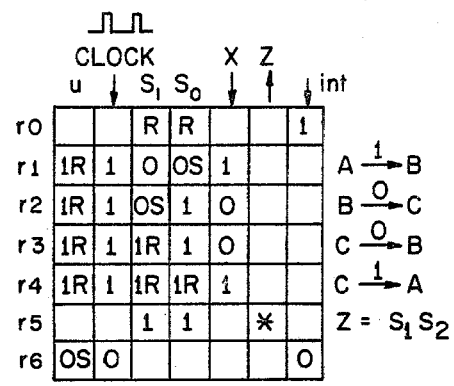

FIG. 3A shows an exemplary state diagram description of a state machine. For this machine $S_1S_o$ are the state variables, x and z are input and output variables, and "int." is the initialization input (a 1 on int. puts the machine in the starting state). FIG. 3B shows the corresponding PSLA implementation. In FIG. 3B, row R0 performs initialization and rows r1–r4 realize transitions of the machine that cause a change in state of the machine. Row r5 arranges output z to be a 1 when the machine is in state 11. Column u together with the clock input synchronizes the transitions to the clock. Row r6 sets column u to a 1 when clock signal is a 0. A transition needs both column u and the clock input to be a 1 in order to fire, and because a transition in the act of firing resets u, at most one transition of the machine takes place in response to a clock pulse.

An important aspect of the PSLA implementation of the sequential machine is that each component of the formal specification of the machine is realized by a distinct component of the SLA program. As such, if alterations are made to the state machine at the formal level of specification, it is immediately clear what alterations are needed in the SLA program. For example, if the machine of FIG. 3A is changed so that state B is now the output state instead of C and the 0 transition from state C goes to state C instead of state B, the program for the new machine may be obtained by deleting row r3 and changing row r5 so that it detects state 01 instead of 11.

EXAMPLE 2—Asynchronous Sequential Machine

Figure 4A:
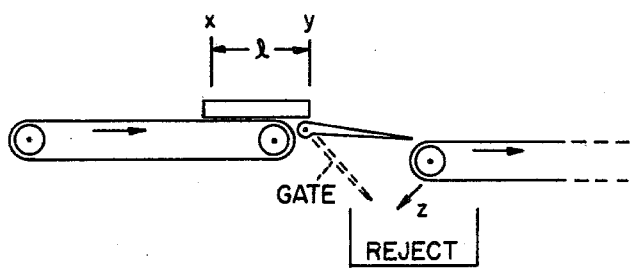
FIGS. 4A, 4B and 4C show an exemplary asynchronous sequential machine, a Petri net specification of that machine, and a representation of a programmed SLA implementation of that machine, respectively.
Figure 4B:
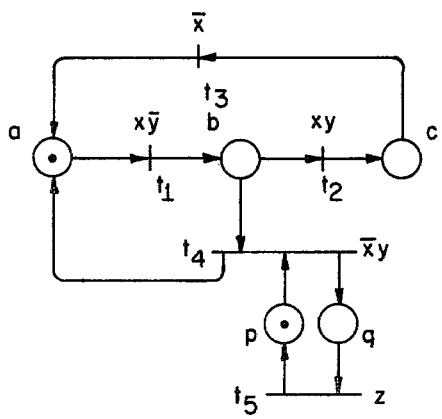
Figure 4C:
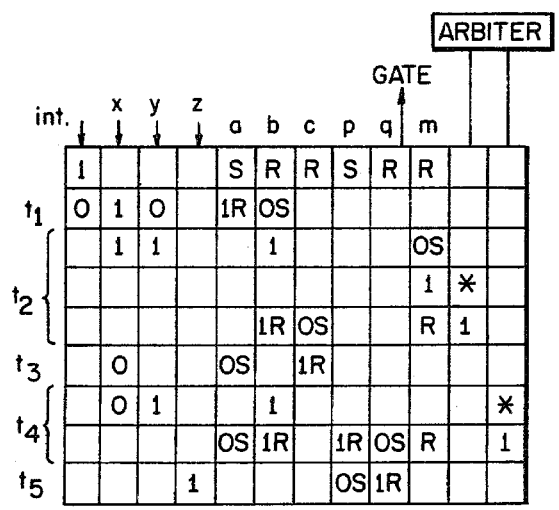

FIG. 4A shows an asynchronous machine which sorts out short bars from a conveyor belt using detectors x and y placed at distance l apart. A formal specification of this asynchronous machine is shown by a Petri net in FIG. 4B. The transitions t1–t5 are defined as:

t1—bar enters detector region
t2—bar longer than
t3—go to test next bar
t4—bar shorter than l; reject and go to test next bar
t5—rejected bar has reached the bin The Petri net specification can be implemented in the PSLA (as shown in FIG. 4C) so that either a single or a group of rows correspond to each Petri net transition, and each input and output port, as well as the internal places, correspond to a column. Column m together with the arbiter resolves conflicts (race condition) that might arise between transitions t2 and t4; a situation which the machine may face when the bar is very close to l units long and the machine has to decide whether to pass it along or reject it. Situations of this kind are fundamental to any testing device. The asynchronous machines designed with conventional methods may malfunction in such situations because these situations call for the use of arbiters. In this regard, the PSLA offers clearly superior circuits for the asynchronous machines. Connecting arbiters to the columns instead of the rows has the advantage that the arbiters can be used from any rows within the array which results in better utilization of the arbiter circuits. Moreover, the same arbiter can be once used to resolve a conflict in one place within the array and to resolve another conflict somewhere else on the array as long as the two conflict situations do not overlap in time.

Figure 5A:
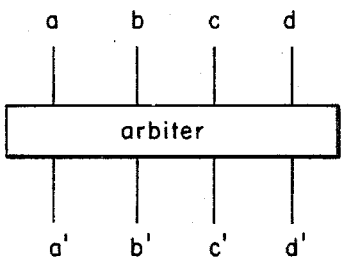
FIGS. 5A and 5B show a four input arbiter in block diagram form, and a programmed SLA implementation of that arbiter, respectively.
Figure 5B:
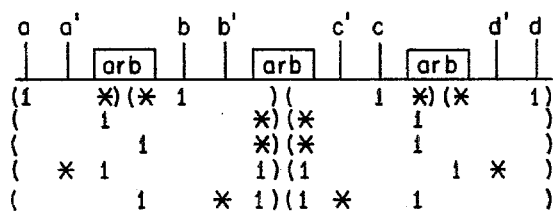

Arbiters essentially implement the mutual exclusion of events. Larger arbiters can be constructed with smaller ones using suitable PSLA programs. By way of example, FIG. 5A shows a four input arbiter in block diagram form. FIG. 5B shows a PSLA implementation of this arbiter, using three 2 input arbiters.

EXAMPLE 3—2's Complement Adder

Figure 6:
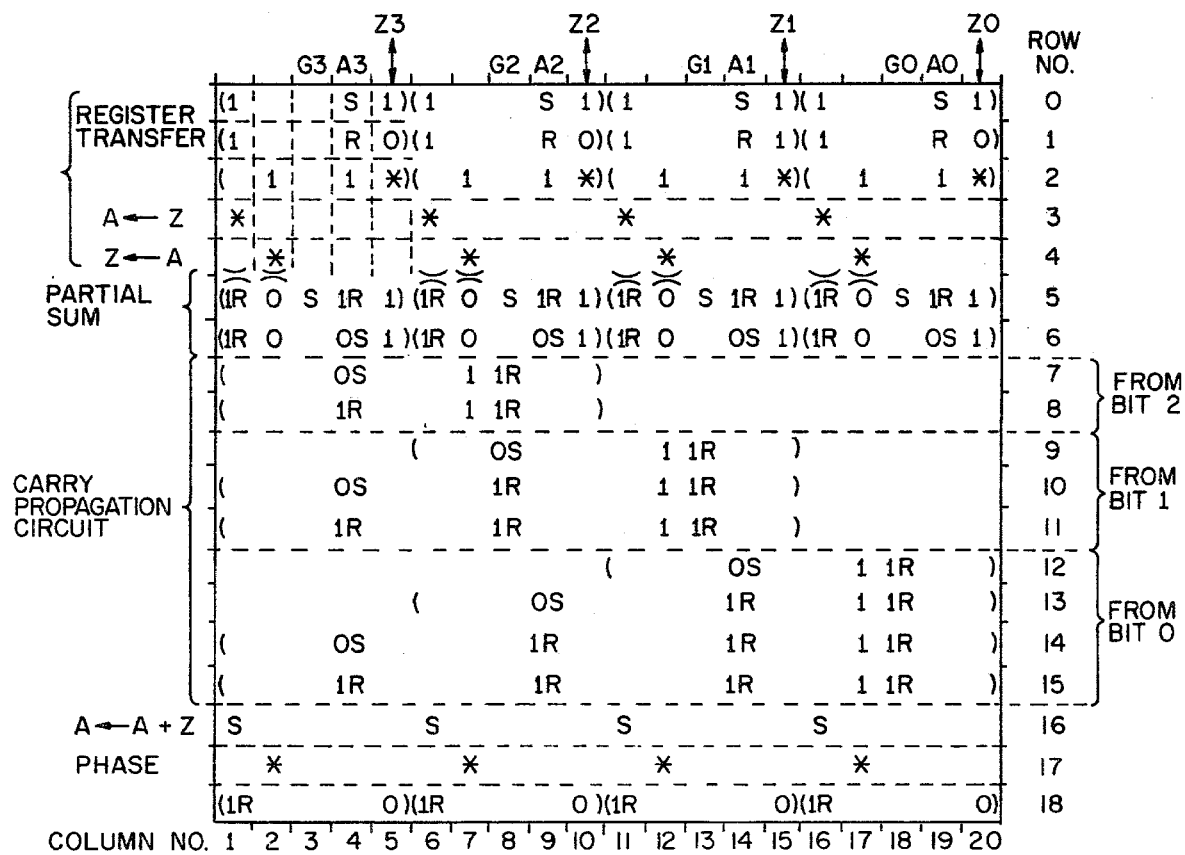
FIG. 6 shows a programmed SLA implementation of a 2's complement adder system.

FIG. 6 shows an implementation of a complete digital sub-system in a single PSLA, in this example, a 2's complement adder unit with an accumulator register. The first five rows of the programmed array provide the ability to transfer data between the accumulator A0–A3 and the external data bus Z0–Z3. Rows 5 and 6 compute the partial sums in the first phase of the computation, and rows 7 to 15 perform the task of propagating the carries in the second phase. Rows 16 and 17 are controls; row 16 initiates the addition and row 17 serves to partition the computation into two phases.

The splitting of the rows and columns into independent segments provides efficient packing of programs. For example, if row splitting was not permitted, the program for the partial sum computation would have required 2n rows instead of just 2 rows (where n is the number of bits in a word). Similar inefficiency would have resulted in realizing the accumulator register if row splitting was not allowed.

The splitting of columns into independent segments with each segment having a storage element permits the building of one register below another in the array. Without such column splitting as a practical matter, the number of column segments available for use in a program would be quickly exhausted and even if there are many empty rows, they could not be used to write larger programs for lack of column segments.

In the preferred embodiment, the PSLA is implemented with I$^2$L technology because of the relative high speed and the density of the circuits. The relatively high speed permits the implementation of LSI circuits for random logic which generally requires high performance (speed). The relatively high density permits a larger digital system to be realized on a single chip, and in addition, tends to minimize the loss of speed due to the signal transmission delays between the chips which tend to be larger compared to the internal delays on a chip. Other technologies, such as T$^2$L and MOS, are also suitable for PSLA design.

By way of example, a PSLA chip might include 12,288 cell networks arranged in an array having 256 rows and 48 columns. In this example, rows are separated into groups of 16, with the cell networks of every sixteenth including a storage element (flip-flop) while the remaining cell networks have no storage element. Each subset of column conductors runs vertically across all 256 rows of the array. Each column conductor includes discretionary contacts which may be selectively broken at the storage elements to form independent segments of columns. The row conductors run horizontally across the chip and include discretionary contacts which may be broken at multiple of four columns to form independent row segments. Thus a minimum length column segment includes sixteen cell networks and a minimum length row segment includes four cell networks. Input/output buffers are located both at the top and at the bottom of the chip; half of the columns are attached to the buffers at the top and the other half to the buffers at the bottom.

The layout of the chip uses two layers of metalization; the column conductors are fabricated in one layer and the row conductors in the other layer. Chip level programming is done by means of a single contact mask which is specific to a given system; all the other masks for the PSLA are the same for all the systems realized with that PSLA. The program gets translated to the presence and absence of contact points for the metallic layers. Contact points are used both to connect or disconnect a logic element into the circuit and to reconfigure cell and I/O connections.

In this exemplary embodiment, there are four conductors in the subset for each column: $\underline{S}$, $\underline{R}$, Q and $\underline{Q}$ (where S, R, and Q represent Boolean signals and the underscore represents a Boolean complement, e.g. $S+\underline{S}=1$). Each column segment in the PSLA may be connected to at least one S-R flip-flop with the column conductors being associated with the corresponding $\underline{S}$, $\underline{R}$, Q and $\underline{Q}$ terminals of the flip-flop. When a column segment spans more than one group, the $\underline{S}$ and $\underline{R}$ conductors run along the entire length of the column segment but the Q and $\underline{Q}$ conductors may span only one group of rows and be driven by the Q and $\underline{Q}$ terminals of the flip-flops attached to that group. Since all the flip-flops are driven by the same $\underline{S}$ and $\underline{R}$ conductors they are always in identical states; different Q and $\underline{Q}$ wires in the same column segment therefore reflect the same state even though driven by different flip-flops.

Figure 7:
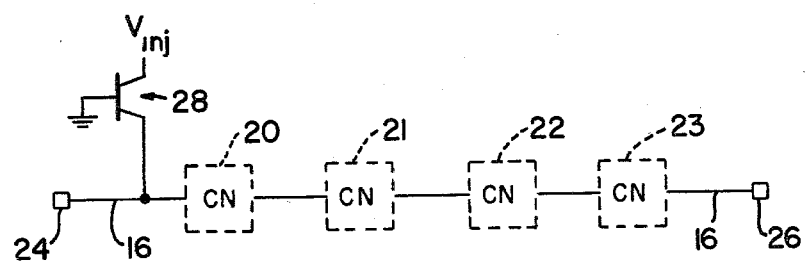
FIG. 7 shows in block diagram and schematic form a minimum length row segment for an exemplary PSLA.

Discretionary connections are used to arrange the storage cells (i.e. the cell networks containing a SR flip-flop) in various configurations to permit column splitting and also to realize various kinds of columns. Discretionary connections are also used to permit splitting of the rows into independent row segments. FIG. 7 shows a minimum length row conductor configuration for the present embodiment which has discretionary contacts for row segmentation located with four column spacing. In FIG. 7, the row conductor 16 is coupled to cell networks 20–23 and to the open circuited discretionary contacts 24 and 26. In addition, FIG. 7 shows a common base transistor 28 coupling a bias voltage $V_{inj}$ to the row conductor. This configuration acts as a curent injector for the I$^2$L elements of the logic networks 20–23.

Figure 8:
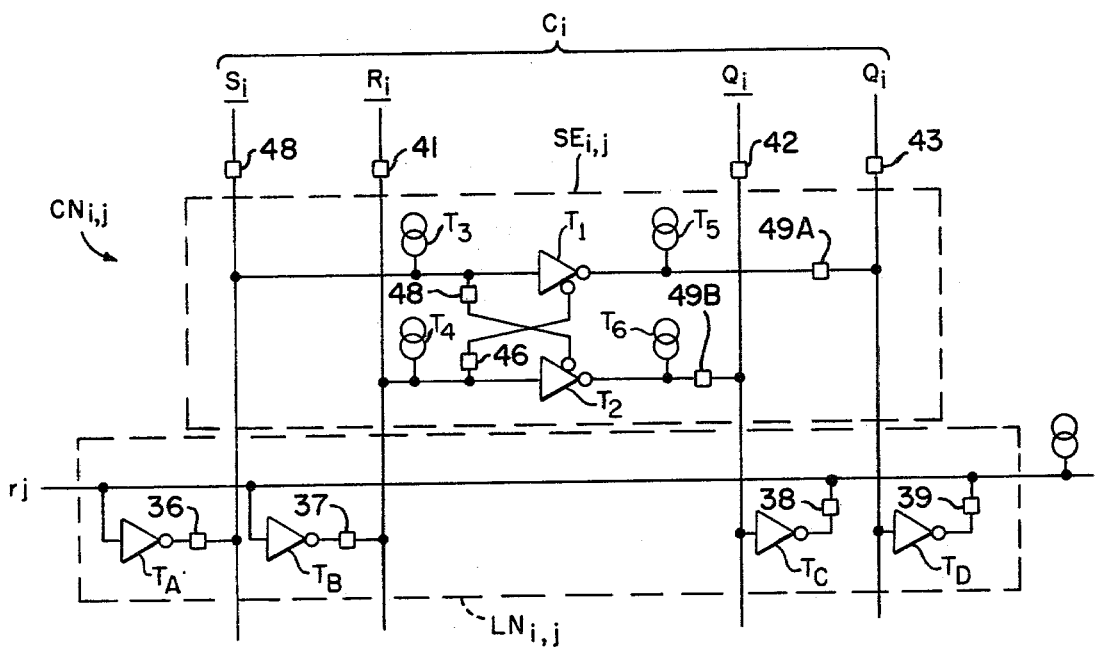
FIG. 8 shows in block diagram form a cell network for an exemplary PSLA.

FIG. 8 shows an I$^2$L cell network with a storage element for the ith column, jth row of the exemplary embodiment. The I$^2$L element symbols in FIG. 8 are defined in FIGS. 9A–9C. The illustrated cell network includes a logic network $LN_{i,j}$ and a storage element $SE_{i,j}$. In the present embodiment, only the cell networks for every sixteenth row (i.e. rows 1, 17, 33, ...) include storage elements, while the remainder include only logic networks. Each logic network in this I$^2$L embodiment includes four transistors $T_A$, $T_B$, $T_C$ and $T_D$ at the crossings of the four column conductors and the row conductor. A contact point associated with each transistor allows that transistor to be either functionally included or excluded from the circuit. Transistors $T_A$ and $T_B$ at the intersection of the row conductor $r_j$ and the $\underline{S}_i$ and $\underline{R}_i$ conductors are arranged so that the bases of the transistors are connected to the row conductors and the collectors are connected to the $\underline{S}_i$ and $\underline{R}_i$ conductors with programmable contact points 36 and 37, respectively. These transistors realize a wired NOR circuit on the $S_i$ and $R_i$ conductors. At the intersection of the $Q_i$ and $\overline{Q}_i$ wires and the row conductor $r_j$, the collectors of the transistors $T_C$ and $T_D$ are connected to the row conductor and their bases are connected to the $Q_i$ and $\overline{Q}_i$ conductors. With the aid of these transistors, the row conductor $r_j$ implements a NOR function of the $Q_i$ and $\overline{Q}_i$ inputs. By selecting the $Q_i$ input when a 1 is to be detected (by way of contact 38) and $\overline{Q}_i$ when a 0 is to be detected (by way of contact 39), the row conductor $r_j$ can be made to implement an AND function of the column states.

The storage element in the cell network of FIG. 8 contains logic elements suitable to implement a Set-Reset flip-flop together with discretionary to connections described below to allow the cell to terminate the column in various ways. The storage element includes a first transistor ($T_1$) coupling the $\underline{S}$ and Q conductors, a second transistor ($T_2$) coupling the $\underline{R}$ and $\overline{Q}$ conductors, and cross-coupling conductors having discretionary contacts 46 and 48. Transistors $T_1$ and $T_2$ together with associated current injectors $T_3$ and $T_4$ constitute the flip-flop. Transistors $T_5$ and $T_6$ act as current injectors for the Q and $\overline{Q}$ output conductors. The cell network of FIG. 8 also includes discretionary contacts 40–43 for selectively establishing a column split at that cell network, and discretionary contacts 49A and 49B for selectively isolating the storage element from Q and $\overline{Q}$ output conductors.

Figure 8A:
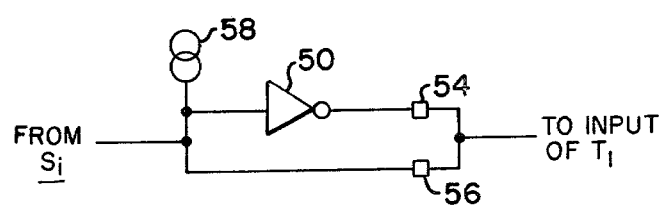
FIG. 8A shows in schematic form an alternative configuration for a portion of the cell network of FIG. 8.

To implement the cell network $C_{i,j}$ of FIG. 8 as a cell network with memory, the contacts 46 and 48 may be conductive to include the flip-flop in that column segment. To implement the cell network $C_{i,j}$ as a cell network without memory, either one or both of contacts 46 and 48 may be left open circuited. With just one of contacts 46 and 48 open circuited, $\underline{S}$ (or $\underline{R}$) is coupled to $\overline{Q}$ (or Q) by a single inverter, and to Q (or $\overline{Q}$) by a pair of series connected inverters. In alternative embodiments, the connection between the $\underline{S}$ conductor and $T_1$ may include a network of the form shown in FIG. 8A. This network includes an inverter 50, a direct connection 52, discretionary contacts 54 and 56 and a current injector 58. The connection between the $\underline{R}$ conductor and $T_2$ may include a similar network. With this configuration, the discretionary contacts may be selectively programmed so that either $\underline{S}$ or $\underline{R}$ or complements of these signals or combinations of these signals may be coupled to the respective inputs of $T_1$ and $T_2$.

Figure 8B:
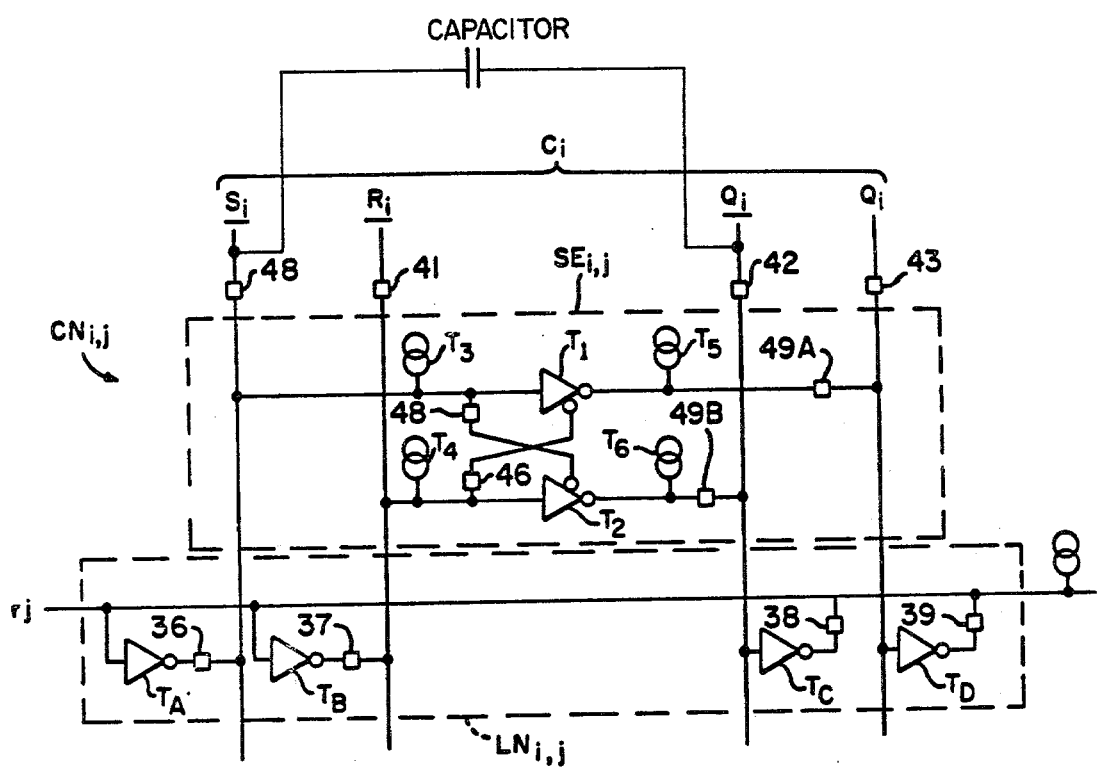
FIG. 8B shows a cell network including a monostable element.
Figure 9A:
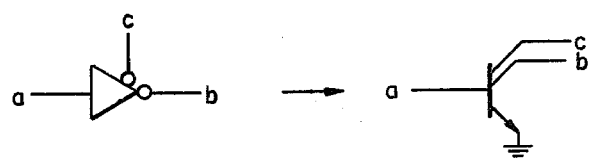
FIGS. 9A, 9B and 9C relate the logic element blocks of the cell network of FIGS. 8, 8A and 8B to exemplary $I^2L$ circuit configurations.
Figure 9B:
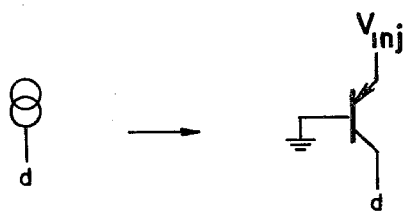
Figure 9C:
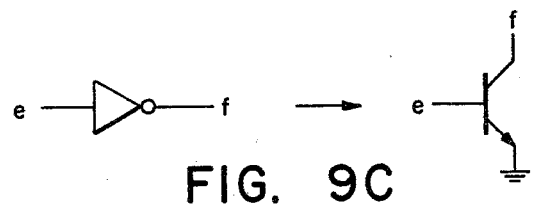

The storage element $SE_{i,j}$ of cell network $CN_{i,j}$ of FIG. 8 may readily be configured as a monostable element as shown in FIG. 8B by coupling an external capacitor between the $\underline{S}_i$ and $Q_i$ conductors with contact 48 open, while establishing (by way of contact 46) a conductive cross coupling connection (by way of contact 46) between the $\underline{R}_i$ and $\overline{Q}_i$ conductors. Alternately, the external capacitor may be coupled between the $\underline{R}_i$ and $\overline{Q}_i$ conductors (with contact 46 open) and the contact 48 may be conductive. These configurations directly correspond to a conventional monostable element.

Figure 10:
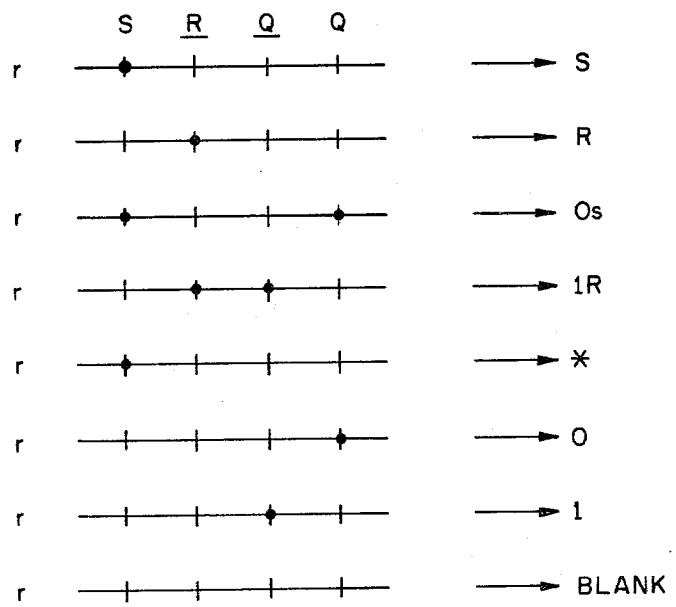
FIG. 10 illustrates in schematic form the program configurations for the logic network of the exemplary cell network of FIG. 8.

FIG. 10 shows some program configurations for the logic network of the cell network of FIG. 8 having an operative storage element (i.e. contacts 46 and 48 conductive) that can be implemented by selection of the discretionary contacts for transistors $T_A$, $T_B$, $T_C$, and $T_D$. In FIG. 10, a dot at the crossing of one of the column conductors and the row conductor represents a connection of the corresponding one of discretionary contacts 36–39. No dot at one of those crossings represents an open circuit for the corresponding discretionary contact.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A programmable storage/logic array comprising
   A. a set of substantially parallel column conductors including a plurality of non-intersecting subsets,
   B. a set of substantially parallel row conductors including a plurality of non-intersecting subsets, said row conductors being orthognal to said column conductors,
   C. a plurality of cell networks, each of said cell networks being associated with one of said subsets of column conductors, and one of said subsets of row conductors,
   wherein at least one of said cell networks includes a storage element, and
   wherein at least one of said cell networks includes programmable cell contact means for selectively coupling said cell network to its associated row and column conductors, and
   wherein said storage element includes means for storing a signal representative of the binary state of one of the conductors of said coupled subsets of column and row conductors, and means for coupling said stored signal to one of the conductors of said coupled subsets of column and row conductors.

2. A programmable storage/logic array according to claim 1 wherein said subset of column conductors for each cell network comprises conductors $S$, $\underline{R}$, Q and $\overline{Q}$ and wherein said subset of row conductors for each cell network comprises conductor r, wherein each of said cell networks having a storage element includes
   programmable means for coupling
      said conductor r to said conductor $\underline{S}$,
      said conductor r to said conductor $\underline{R}$,
      said conductor Q to said conductor r, and
      said conductor $\overline{Q}$ to said conductor r of said cell network, and
   wherein said storage element includes:
      means for coupling
         the $\underline{S}$ conductor to the Q conductor, and
         the $\underline{R}$ conductor to the $\overline{Q}$ conductor of its associated cell network by way of first and second gate elements, respectively, and
      first and second programmable cross-coupling means for coupling
         an output of said first gate to an input of said and second gate and
         an output of said second gate to an input of said first gate, respectively, of its associated cell network.

3. A programmable storage/logic array according to claim 2 wherein said gate elements are I²L elements and said array further includes means to couple bias means to said cell networks for current injection.

4. A programmable storage/logic array according to claim 3 wherein one of said $\underline{S}$ and $\underline{R}$ conductors is coupled to external circuit elements whereby said storage element is a monostable element.

5. A programmable storage/logic array according to claim 2 wherein one of said S and R conductors is coupled to external circuit elements whereby said storage element is a monostable element.

6. A programmable storage/logic array according to claim 2 further comprising:
programmable row contact means for segmenting selected ones of said subsets of row conductors into corresponding subsets of row segments, and
programmable column means for segmenting selected ones of said subsets of column conductors into corresponding subsets of column segments.

7. A programmable storage/logic array according to claim 6 wherein at least one subset of column segments has at least one associated cell network which includes a storage element.

8. A programmable storage/logic array according to claim 2
wherein at least one other of said cell networks includes programmable means for coupling
said conductor r to said conductor S,
said conductor r to said conductor R,
said conductor Q to said conductor r, and
said conductor Q to said conductor r of said cell network.

9. A programmable storage/logic array according to claim 2 wherein said first and second gate elements are inverting elements.

10. A programmable storage/logic array according to claim 2 wherein said first and second gate elements are non-inverting elements.

11. A programmable storage/logic array according to claim 2 wherein said means for coupling
the S conductor to the Q conductor, and
the R conductor to the Q conductor are programmable gates.

12. A programmable storage/logic array according to claim 11 wherein said programmable gates include means for programmably coupling said S to Q and R to Q conductors by way of inverting or non-inverting elements.

13. A programmable storage/logic array according to claim 1 further comprising:
programmable row contact means for segmenting selected ones of said subsets of row conductors into corresponding subsets of row segements, and
programmable column contact means for segmenting selected ones of said subsets of column conductors into corresponding subsets of column segments.

14. A programmable storage/logic array according to claim 13 wherein at least one subset of column segments has at least one associated cell network which includes a storage element.

15. A programmable storage/logic array according to claim 1 wherein each subset of column conductors has at least one associated cell network which includes a storage element.

16. A programmable storage/logic array according to claim 15 further comprising:
programmable row contact means for segmenting selected ones of said subsets of row conductors into corresponding subsets of row segments,
programmable column contact means for segmenting selected ones of said subsets of column conductors into corresponding subsets of column segments.

17. A programmable storage/logic array according to claim 16 wherein at least one subset of column segments has at least one associated cell network which includes a storage element.

18. A storage/logic array comprising
A. a set of substantially parallel column conductors including a plurality of non-intersecting subsets, at least one of said column conductors having an associated binary state,
B. a set of substantially parallel row conductors including a plurality of non-intersecting subsets, said row conductors being orthogonal to said column conductors, at least one of said row conductors having an associated binary state,
C. a plurality of cell networks, each of said cell networks being associated with and coupled to one of said subsets of column conductors and one of said subsets of row conductors, wherein at least one of said cell networks includes a storage element, and
wherein said storage element includes means for storing a signal representative of the binary state of one of the conductors of said coupled subsets of column and row conductors, and means for coupling said stored signal to one of the conductors of said coupled subsets of column and row conductors.

19. A storage/logic array according to claim 18 wherein said subset of column conductors for each cell network comprises conductors S, R, Q and Q, and wherein said subset of row conductors for each cell network comprises conductor r,
wherein at least one of said cell networks including a storage element includes:
means for coupling
said conductor S to said conductor Q, and
said conductor R to said conductor Q, of said cell network by way of first and second gate elements, respectively, and
means for coupling
an output of said first gate to an input of said second gate, and
an output of said second gate to an input of said first gate of said cell network.

20. A storage/logic array according to claim 19 wherein said gate elements are $I^2L$ elements and said array further includes means to couple bias means to said cell networks for current injection.

21. A storage/logic array according to claim 20 wherein at least one other of said cell networks including a storage element and not coupled to the same said S, R, Q and Q conductors as said one cell network including a storage element includes:
means for coupling
said conductor S to said conductor Q, and
said conductor R to said conductor Q of said cell network by way of first and second gate elements, respectively,
wherein one of said S and R conductors is coupled to external circuit elements whereby said storage element is a monostable element.

22. A storage/logic array according to claim 19 wherein at least one other of said cell networks including a storage element and not coupled to the same S, R, Q and Q conductors as said one cell network including a storage element includes:
means for coupling
said conductor S to said conductor Q, and said conductor R to said conductor Q of said cell network by way of first and second gate elements, respectively, wherein one of said S and R conductors is coupled to external circuit elements whereby said storage element is a monostable element.

23. A storage/logic array according to claims 21 or 22 or 19 wherein at least another of said cell networks coupled to the S, R, Q and Q conductors as said other cell network including a storage element includes:
means for coupling
said conductor r to said conductor S of said cell network.

24. A storage/logic array according to claims 21 or 22 or 19 wherein at least another of said cell networks coupled to the S, R, Q and Q conductors as said other cell network including a storage element includes means for coupling said conductor r to said conductor R of said cell network.

25. A storage/logic array according to claims 21 or 22 or 19 wherein at least another of said cell networks coupled to the S, R, Q and Q conductors as said other cell network including a storage element includes means for coupling said conductor Q to said conductor r of said cell network.

26. A storage/logic array according to claims 21 or 22 or 19 wherein at least another of said cell networks coupled to the S, R, Q and Q conductors as said other cell network including a storage element includes means for coupling said conductor Q to said conductor r of said cell network.

27. A programmable storage/logic array according to claim 19 wherein
at least one of said subsets of row conductors is segmented into corresponding subsets of row segments, and
at least one of said subsets of column conductors is segmented into corresponding subsets of column segments.

28. A programmable storage/logic array according to claim 27 wherein at least one subset of column segments has at least one associated cell network which includes a storage element.

29. A storage/logic array according to claim 19 wherein said on cell network including a storage element includes:
means for coupling
said conductor r to said conductor S of said cell network.

30. A storage/logic array according to claim 19 wherein said one cell network including a storage element includes means for coupling said conductor r to said conductor R of said cell network.

31. A storage/logic array according to claim 19 wherein said one cell network including a storage element includes means for coupling said conductor Q to said conductor r of said cell network.

32. A storage/logic array according to claim 19 wherein said one cell network including a storage element includes means for coupling said conductor Q to said conductor r of said cell network.

33. A programmable storage/logic array according to claim 18 wherein
at least one of said subsets of row conductors is segmented into corresponding subsets of row segments, and
at least one of said subsets of column conductors is segmented into corresponding subsets of column segments.

34. A programmable storage/logic array according to claim 33 wherein at least one subset of column segments has at least one associated cell network which includes a storage element.

35. A programmable storage/logic array according to claim 18 wherein each subset of column conductors has at least one associated cell network which includes a storage element.

36. A programmable storage/logic array according to claim 35 wherein
at least one of said subsets of row conductors is segmented into corresponding subsets of row segments,
at least one of said subsets of column conductors is segmented into corresponding subsets of column segments.

37. A programmable storage/logic array according to claim 36 wherein at least one subset of column segments has at least one associated cell network which includes a storage element.

* * * * *